United States Patent [19]
Hwang

[11] Patent Number: 6,049,210
[45] Date of Patent: Apr. 11, 2000

[54] DEVICE FOR DISPLAYING REMAINING BATTERY CAPACITY

[75] Inventor: Jung-Wook Hwang, Suwon, Rep. of Korea

[73] Assignee: Samsung Electronics Co., Ltd., Rep. of Korea

[21] Appl. No.: 09/009,705

[22] Filed: Jan. 20, 1998

[30] Foreign Application Priority Data

Jan. 17, 1997 [KR] Rep. of Korea .......................... 97-1240

[51] Int. Cl.[7] .............................. G01N 27/27; H02J 7/04
[52] U.S. Cl. .......................... 324/428; 324/427; 320/134
[58] Field of Search .................. 324/426, 427, 324/428, 433; 320/134, 136, 149; 702/63; 340/636

[56] References Cited

U.S. PATENT DOCUMENTS

| | | | |
|---|---|---|---|
| 4,194,146 | 3/1980 | Patry et al. | 324/433 |
| 4,307,330 | 12/1981 | Belot | 320/134 |
| 4,678,999 | 7/1987 | Schneider | 324/427 |
| 4,803,416 | 2/1989 | Abiven et al. | 32/134 |
| 5,144,218 | 9/1992 | Bosscha | 320/134 |
| 5,357,203 | 10/1994 | Landau et al. | 324/427 |
| 5,545,969 | 8/1996 | Hasegawa | 320/134 |

FOREIGN PATENT DOCUMENTS

| | | | |
|---|---|---|---|
| 0425044 A1 | 5/1991 | European Pat. Off. | G01R 31/36 |
| 1237208 | 6/1971 | United Kingdom | H01M 45/06 |
| 2147109 | 5/1985 | United Kingdom | G01R 31/36 |
| WO 94/01784 | 1/1994 | WIPO | G01R 31/36 |

*Primary Examiner*—Diep N. Do
*Attorney, Agent, or Firm*—Dilworth & Barrese

[57] ABSTRACT

A device for displaying the remaining capacity of a rechargeable battery is provided. The device includes a current sensing resistor connected between an external power source and the rechargeable battery, for sensing the charge current and the discharge current of the rechargeable battery. A current-to-frequency converter converts the charge and discharge currents into first and second count signals having first and second frequencies. A microprocessor compares the first and second frequencies with a predetermined frequency, to measure the remaining capacity of the rechargeable battery and generate display data accordingly. A display displays the remaining capacity of the battery. Therefore, the device can accurately display the remaining capacity and charging state of the rechargeable battery, without employing an expensive A/D converter.

8 Claims, 2 Drawing Sheets

DEVICE FOR DISPLAYING REMAINING BATTERY CAPACITY

BACKGROUND OF THE INVENTION

1. Field of the Invention

The present invention relates to a battery capacity indicator, and in particular, to a device for accurately displaying the remaining capacity and the charging state of a rechargeable battery.

2. Description of the Related Art

A battery charge controller, disclosed in U.S. Pat. No. 5,315,228, issued to Hess, et. al., monitors the voltage, temperature, charge and discharge current of a rechargeable battery, to calculate the battery's charge capacity and charge level. Conventionally, each time the battery is fully discharged, any calculated charge level remaining is divided by two and subtracted from the previously calculated charge capacity. When the battery is fully charged, the charge level is set equal to the charge capacity. During subsequent charge and discharge, the current is converted to a Coulomb count and added or subtracted from the charge level to maintain an accurate charge level indication. Fast charge inefficiency due to temperature is considered by subtracting a temperature proportional factor before the charge level of the battery is updated. The charge level, voltage and temperature are used to determine the optimal fast charge termination point to achieve full charge and prevent temperature abuse and overcharging. A fast charge is applied only if the battery is within proper voltage and temperature ranges. The battery charge controller includes a microcontroller within the same battery pack as the battery, which is powered by the battery when AC power is unavailable. The microcontroller consumes very little power and measures circuit errors to assure data accuracy and time periods of self-discharge, and updates the charge level accordingly. The microcontroller also includes a memory to store the battery charge information and a communication port to provide the charge information.

However, the conventional battery charge controller includes an expensive analog-to-digital (A/D) converter for converting the battery voltage into a digital signal. The microcontroller reads the digital signal and switches the charge mode from the fast charge mode to the trickle charge mode if the read digital signal reaches a specified value. For that purpose, the peripheral elements (e.g., resistor and capacitor) of the A/D converter should be very precise. Although the A/D converter has precise peripheral elements, if the resolution of the A/D converter is very low, it is difficult to accurately measure the battery voltage. Generally, as the resolution of the A/D converter increases higher and higher, the A/D converter becomes more and more expensive. When using an A/D converter having the lower resolution, the battery charger may cause undercharge or overcharge of the rechargeable battery. Furthermore, the device may display an inaccurate remaining capacity indication of the battery, which differs from the actual capacity of the battery.

SUMMARY OF THE INVENTION

It is therefore an object of the present invention to provide a device for accurately displaying a remaining capacity and a charging state of a rechargeable battery, without employing an expensive A/D converter.

To achieve the above and other objects, there is provided a device for displaying the remaining capacity of a rechargeable battery. The device includes a current sensing resistor connected between an external power source and the rechargeable battery, for sensing a charge current and a discharge current of the rechargeable battery. A current-to-frequency converter converts the charge and discharge currents into first and second count signals having first and second toggle frequencies. A microprocessor compares the first and second frequencies with a predetermined frequency, to measure the remaining capacity of the rechargeable battery and generate display data accordingly. A display device displays the remaining capacity of the battery.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF PREFERRED EMBODIMENTS

Figure 1:
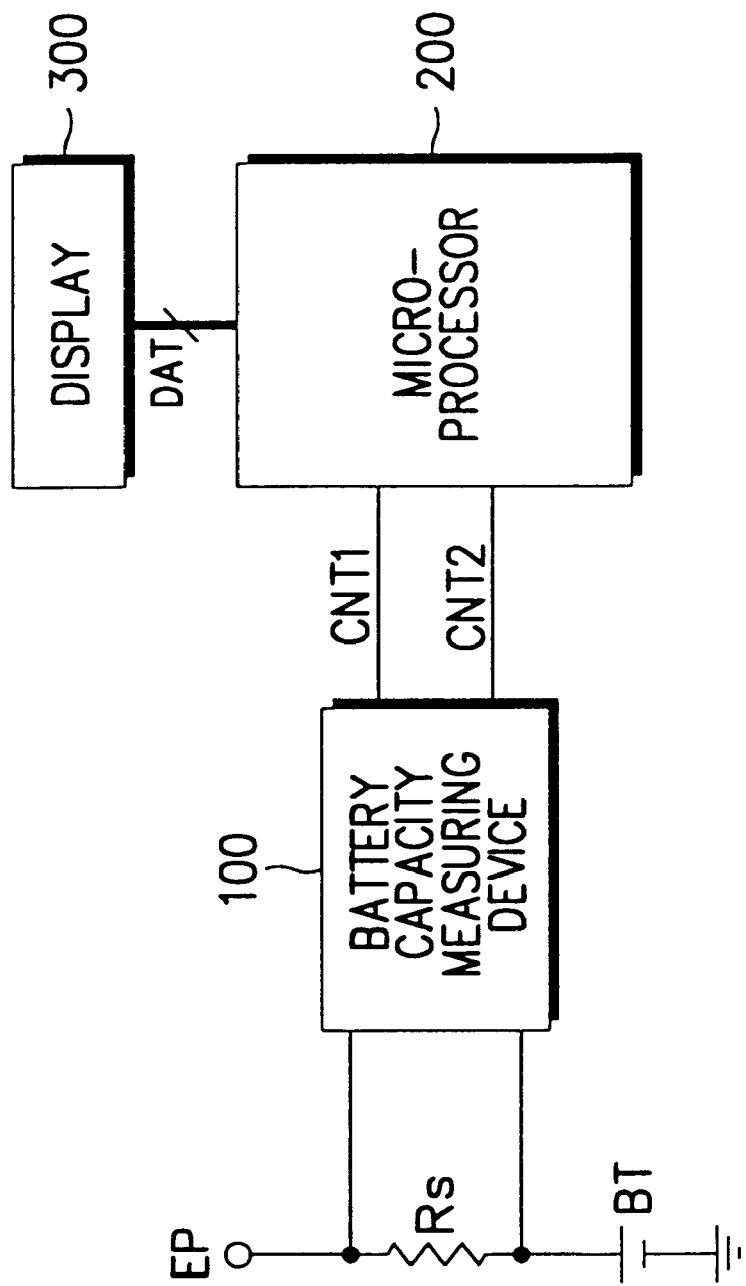
FIG. 1 is a block diagram of a device for displaying a remaining capacity of a rechargeable battery according to an embodiment of the present invention.

A preferred embodiment of the present invention will be described in detail hereinbelow with reference to the accompanying drawings. It should be noted that like reference numerals designate like elements throughout several views. For comprehensive understanding of the present invention, the present invention will be illustratively described, confined to the specific embodiment. However, it should be noted that the present invention can be implemented by anyone skilled in the art with the description, not the details. In the following description, well-known functions or constructions which may obscure the present invention in unnecessary detail are not described in detail.

Referring to FIG. 1, the device for displaying the remaining capacity of a battery according to the present invention includes a battery capacity measuring circuit 100, a microprocessor 200, and a display 300. The battery capacity measuring circuit 100 has input ends connected in parallel with a current sensing resistor Rs which is connected between an external power source EP and a rechargeable battery BT. The current sensing resistor Rs senses charge and discharge current of the rechargeable battery BT. The battery capacity measuring circuit 100 serving as a current-to-frequency converter, converts the charge and discharge current into first and second count signals CNT1 and CNT2 having first and second toggle frequencies, respectively. The microprocessor 200 compares the toggle frequencies of the first and second count signals CNT1 and CNT2 with a predetermined value, to check the remaining capacity of the rechargeable battery BT. The display 300 can be, for example, a liquid crystal display (LCD), displays thereon the remaining capacity of the rechargeable battery BT.

Figure 2:
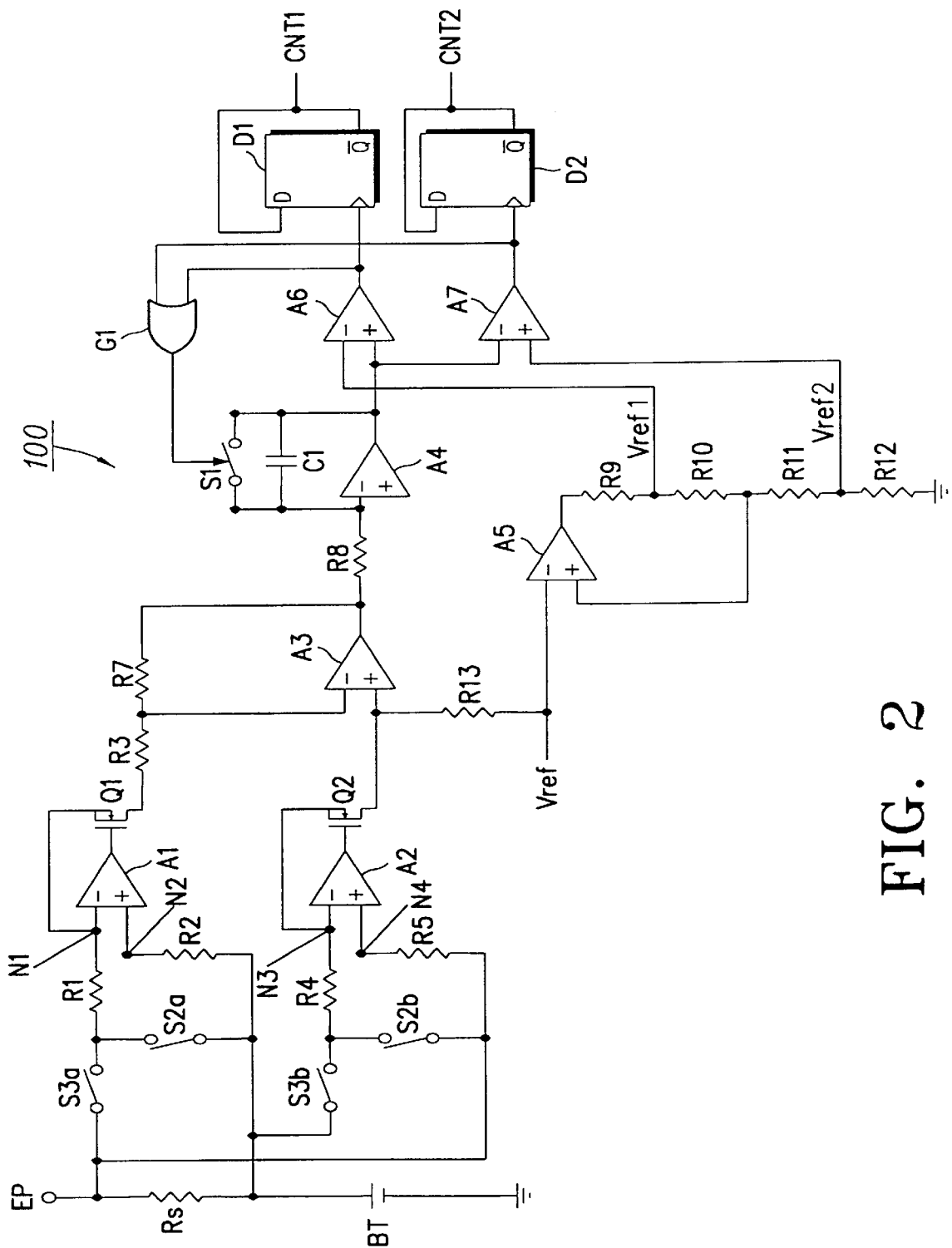
FIG. 2 is a detailed schematic circuit diagram of the battery capacity measuring circuit (100) of FIG. 1 according to a preferred embodiment of the present invention.

FIG. 2 illustrates a detailed circuit diagram of the battery capacity measuring device 100. As illustrated, a first operational amplifier A1 senses the charge current, and a second operational amplifier A2 measures the discharge current of the rechargeable battery BT. A summing amplifier A3 sums the outputs of the first and second operational amplifiers A1 and A2. A first transistor Q I connected between an output end of the first operational amplifier AI and an inverse input end (−) of the summing amplifier A3 functions as a level shifter. Similarly, a second transistor Q2 connected between an output end of the second operational amplifier A2 and a non-inverse input end (+) of the summing amplifier A3 functions as a level shifter. An integrator A4 integrates an output of the summing amplifier A3. An operational amplifier A5 receives an external reference signal Vref to generate first and second reference signals Vref 1 and Vref2 by using voltage dividing resistors R9, R10, RI1 and R12. A first cooperator A6 compare's an output of the integrator A4 with the first reference signal Vref 1, and a second cooperator A7 compares the output of the integrator A4 with the second reference signal Vref2. An OR gate GI ORs the outputs of the first and second comparators A6 and A7, respectively, to generate a control signal for controlling a reset switch S1. The reset switch S1 has first and second ends connected respectively to input and output ends of the integrator A4 and resets the integrator A4 in response to the control signal output from the OR gate GI. A first switch S2a connected between either input ends of the first operational amplifier AI is turned on during offset measurement. Similarly, a second switch S2b connected between either input ends of the second operational amplifier A2 is turned on during the offset measurement. A third switch S3a connected between the external power source EP and an inverse input end (−) of the first operational amplifier Al is turned off during the offset measurement. Similarly, a fourth switch S3b connected between an inverse input end (−) of the second operational amplifier A2 and a node of the current sensing resistor Rs and the rechargeable battery BT is turned off during the offset measurement. First and second D flip-flops D1 and D2 toggles the first and second output count signals CNTI and CNT2 in synch with the outputs of the first and second comparators A6 and A7, respectively.

In operation, the current sensing resistor Rs senses the charge and discharge current of the rechargeable battery BT. The first operational amplifier A1 measures the charge current of the rechargeable battery BT, in a charge mode. The second operational amplifier A2 measures the discharge current of the rechargeable battery BT, in a discharge mode. Herein, the first and second operational amplifiers A1 and A2 function as a combined amplifier, and the first and second transistors Q1 and Q2 function as a level shifter. In the charge mode of the rechargeable battery BT, the external power source EP having a voltage higher than a voltage of the rechargeable battery BT is supplied to the circuit, so that the voltage at node N1 is higher than the voltage at node N2. Thus, the first operational amplifier A1 generates the logic "low" level, thereby turning on the first transistor Q1. On the contrary, since the voltage at node N3 is lower than the voltage at a node N4, the second operational amplifier A2 generates the logic "high" level, thereby turning off the second transistor Q2. At this moment, since the high voltage of the external power source EP is applied to the inverse input end (−) of the summing amplifier A3, the output of the summing amplifier A3 wi 'II decrease. The decrease of the output voltage of the summing amplifier A3 will cause the output voltage of integrator A4 to increase. If the output voltage of integrator A4 increases to exceed the first reference voltage Vref 1, the first cooperator A6 generates the logic "high" level, so that OR gate GI turns on reset switch SI to reset integrator A4. At this moment, an integration capacitor C1 connected in parallel with the reset switch SI will be discharged completely. The output of the first cooperator A6 is applied to a clock terminal of the first D flip-flop DI, to toggle the first count signal CNTL.

In the discharge mode of the rechargeable battery BT, the external power source EP is cut off, so that the voltage at node N1 is lower than the voltage at node N2. Then, the output of the first operational amplifier A1 goes to the logic "high" level, turning off the first transistor Q1. On the contrary, since the voltage at node N3 is higher than the voltage at node N4, the output of the second operational amplifier A2 goes to the logic "low" level, thereby turning on the second transistor Q2. Then, the high voltage of the external power source EP is applied to the non-inverse input end (+) of the summing amplifier A3, so that the summing amplifier A3 may increase its output voltage. Increasing the output voltage of summing amplifier A3 causes the output voltage of integrator A4 to decrease. If the output of the integrator A4 decreases below the second reference voltage Vref2, the second cooperator A7 generates the logic "high" level, so that OR gate GI turns on the reset switch SI to reset integrator A4. At this moment, the integration capacitor C1 connected in parallel to the reset switch SI will be discharged completely. The output of the second cooperator A7 is applied to a clock terminal of the second D flip-flop D2, to toggle the second count signal CNT2. The toggle frequencies of the first and second counters CNT1 and CNT2 are measured at the microprocessor 200. The voltage dividing resistors R9, R10, RI 1 and R12 are connected in series between an output end of the operational amplifier A5 and ground, to generate the first and second reference voltages Vref I and Vref2, which can be properly varied according to the desired application. Here, impreciseness of the circuit may cause an offset error, a gain error and a nonlinear error, etc. The offset error is among the most important factors in maintaining an accurate charge level. The offset error is mainly derived from the offset voltage input to the first, and second operational amplifiers A1 and A2. In order to compensate for the offset error, the circuit according to the present invention turns off (i.e., opens) switches S2a and S2b and turns on (i.e., closes) switches S3a and S3b, in normal operation. On the contrary, the circuit turns off (i.e., opens) switches S3a and S3b and turns on (i.e., closes) switches S2a and S2b, during the offset measurement.

Now, referring to FIGS. 1 and 2, the microprocessor 200 compensates for the offset error according to the toggle frequencies of the first and second count signals CNT I and CNT2. In the charge mode of the rechargeable battery, the first D flip-flop D1 increases the toggle frequency of the first count signal CNT 1 when the rechargeable battery BT has a small remaining capacity, but it decreases the toggle frequency of the first count signal CNT1 when the rechargeable battery BT has a large remaining capacity (i.e., when it is fully charged). The microprocessor 200 compares the toggle frequency of the first count signal CNT 1 with a predetermined value to generate display data to display the remaining battery capacity on the display 300.

In the discharge mode of the rechargeable battery, the second D flip-flop D2 increases the toggle frequency of the second count signal CNT2 when rechargeable battery BT has a large remaining capacity, but it decreases the toggle frequency of the second count signal CNT2 when the rechargeable battery BT has a small remaining capacity due to consumption of the battery. The microprocessor 200 compares the toggle frequency of the second count signal CNT2 with a predetermined value to generate the display data to display the remaining battery capacity on the display 300.

As apparent from the foregoing, the device according to the present invention can accurately display the remaining capacity and a charging state of the rechargeable battery, without employing an expensive A/D converter.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A device for displaying a remaining capacity of a rechargeable battery, comprising:
   a current sensing resistor connected between an external power source and said rechargeable battery, for sensing a charge current and a discharge current of said rechargeable battery;
   a current-to-frequency converter for converting said charge and discharge currents into charge and discharge count signals having charge and discharge frequencies, respectively;
   a microprocessor for directly receiving said charge and discharge count signals independently and comparing the respective charge and discharge frequencies with a predetermined frequency, thereby calculating the remaining capacity of the rechargeable battery and generating display data relating thereto; and
   a display for displaying the remaining capacity according to said display data.

2. The device as claimed in claim 1, wherein said current-to-frequency converter comprises:
   a first operational amplifier connected in parallel to said current sensing resistor, for measuring said charge current;
   a second operational amplifier connected in parallel to said current sensing resistor, for measuring said discharge current;
   a summing amplifier for summing outputs of said first and second operational amplifiers;
   an integrator for integrating an output of said summing amplifier; a first comparator for comparing an output of said integrator with a first reference voltage;
   a second comparator for comparing the output of said integrator with a second reference voltage;
   an OR gate for ORing outputs of said first and second comparators;
   a reset switch having first and second ends connected respectively to input and output ends of said integrator, for resetting said integrator in response to an output of said OR gate; and
   first and second flip-flops for toggling said charge and discharge count signals in sync with the outputs of said first and second comparators.

3. The device as claimed in claim 2, further comprising:
   a first switch connected between either input ends of said first operational amplifier, said first switch being turned on during an offset measurement;
   a second switch connected between either input ends of said second operational amplifier, said second switch being turned on during the offset measurement;
   a third switch connected between said external power source and an is inverse input end of said first operational amplifier, said third switch being turned off during the offset measurement; and
   a fourth switch connected between an inverse input end of said second operational amplifier and a node of said sensing resistor and said rechargeable battery, said fourth switch being turned off during the offset measurement.

4. An apparatus for indicating the remaining capacity of a rechargeable battery comprising:
   means for sensing a charge and discharge current of the rechargeable battery;
   means for converting the charge and discharge currents into charge and discharge count signals having charge and discharge frequencies, respectively;
   a microprocessor for directly receiving said charge and discharge count signals independently and comparing the respective charge and discharge frequencies with a predetermined frequency, thereby calculating the remaining capacity of the rechargeable battery and generating display data relating thereto; and
   means for displaying the remaining capacity of the rechargeable battery.

5. The apparatus according to claim 4, wherein said converting means is a current to frequency converter.

6. The apparatus according to claim 5, wherein said reference signal is a predetermined frequency value, and said charge and discharge frequencies are compared with said predetermined frequency value to measure the remaining capacity of the rechargeable battery.

7. The apparatus according to claim 4, wherein said microprocessor generates display data representative of the remaining capacity of the rechargeable battery.

8. The apparatus according to claim 4, wherein said display means is a liquid crystal display (LCD).

* * * * *